(12) United States Patent
Glass et al.

(10) Patent No.: US 9,224,735 B2
(45) Date of Patent: Dec. 29, 2015

(54) SELF-ALIGNED CONTACT METALLIZATION FOR REDUCED CONTACT RESISTANCE

(71) Applicant: INTEL CORPORATION, Santa Clara, CA (US)

(72) Inventors: Glenn A. Glass, Beaverton, OR (US); Anand S. Murthy, Portland, OR (US); Tahir Ghani, Portland, OR (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 14/739,994

(22) Filed: Jun. 15, 2015

(65) Prior Publication Data

US 2015/0311204 A1   Oct. 29, 2015

Related U.S. Application Data

(63) Continuation of application No. 13/976,075, filed as application No. PCT/US2011/066134 on Dec. 20, 2011, now Pat. No. 9,059,024.

(51) Int. Cl.
*H01L 21/70* (2006.01)
*H01L 27/092* (2006.01)
(Continued)

(52) U.S. Cl.
CPC ............ *H01L 27/0922* (2013.01); *H01L 29/16* (2013.01); *H01L 29/20* (2013.01); *H01L 29/41725* (2013.01)

(58) Field of Classification Search
CPC ................... H01L 29/7834; H01L 29/41791; H01L 21/28575; H01L 21/823821
USPC ......................................................... 257/369
See application file for complete search history.

(56) References Cited

U.S. PATENT DOCUMENTS 7,943,469 B2   5/2011   Cook et al.
9,059,024 B2   6/2015   Glass et al.
(Continued)

FOREIGN PATENT DOCUMENTS

WO   2013/095377 A1   6/2013

OTHER PUBLICATIONS

International Preliminary Report on Patentability and Written Opinion received for PCT Patent Application No. PCT/US2011/066134, mailed on Jul. 3, 2014, 8 pages. *

(Continued)

*Primary Examiner* — Douglas Menz
(74) *Attorney, Agent, or Firm* — Finch & Maloney PLLC

(57) ABSTRACT

Techniques are disclosed for forming low contact resistance transistor devices. A p-type germanium layer is provided between p-type source/drain regions and their respective contact metals, and an n-type III-V semiconductor material layer is provided between n-type source/drain regions and their respective contact metals. The n-type III-V semiconductor material layer may have a small bandgap (e.g., <0.5 eV) and/or otherwise be doped to provide desired conductivity, and the p-type germanium layer can be doped, for example, with boron. After deposition of the III-V material over both the n-type source/drain regions and the germanium covered p-type source/drain regions, an etch-back process can be performed to take advantage of the height differential between n and p type regions to self-align contact types and expose the p-type germanium over p-type regions and thin the n-type III-V material over the n-type regions. The techniques can be used on planar and non-planar transistor architectures.

20 Claims, 8 Drawing Sheets

(51) Int. Cl.
*H01L 29/16* (2006.01)
*H01L 29/20* (2006.01)
*H01L 29/417* (2006.01)

(56) References Cited

U.S. PATENT DOCUMENTS

2006/0186482 A1 8/2006 Miyata
2006/0244073 A1 11/2006 Chaudhry
2009/0261381 A1 10/2009 Kim et al.
2010/0258869 A1 10/2010 Morita et al.
2011/0049613 A1 3/2011 Yeh et al.
2013/0277752 A1 10/2013 Glass et al.

OTHER PUBLICATIONS

International Search Report and Written Opinion received for PCT Patent Application No. PCT/US2011/066134, mailed on Aug. 30 2012 11 pages. *

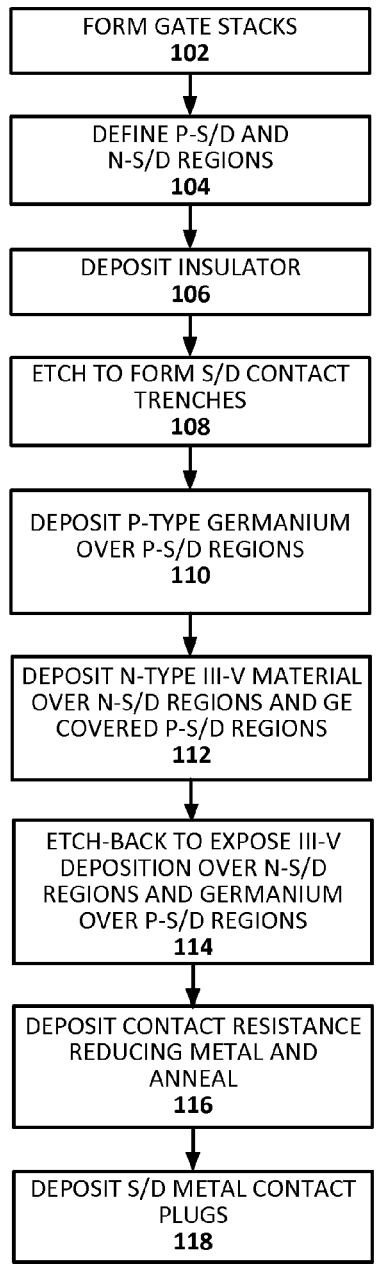
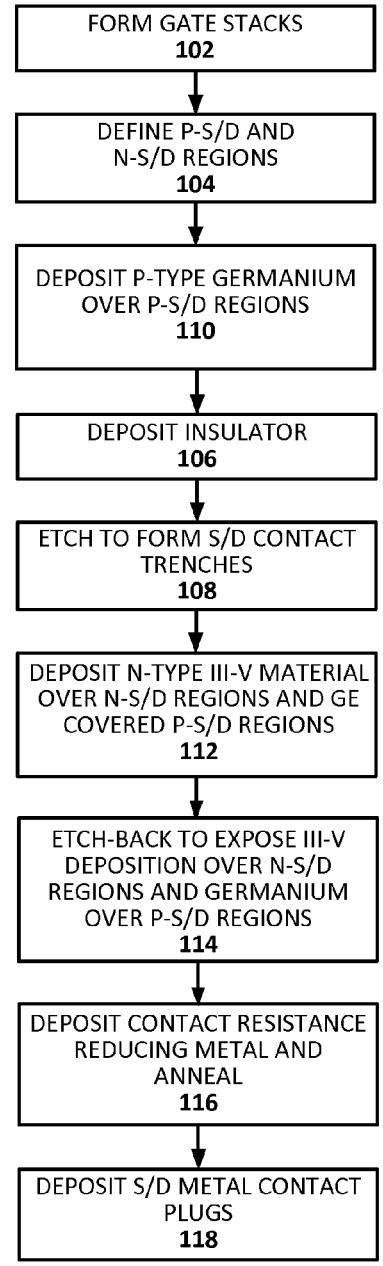
FIG. 1A
FIG. 1B

SELF-ALIGNED CONTACT METALLIZATION FOR REDUCED CONTACT RESISTANCE

BACKGROUND

Increased performance of circuit devices including transistors, diodes, resistors, capacitors, and other passive and active electronic devices formed on a semiconductor substrate is typically a major factor considered during design, manufacture, and operation of those devices. For example, during design and manufacture or forming of, metal oxide semiconductor (MOS) transistor semiconductor devices, such as those used in a complementary metal oxide semiconductor (CMOS), it is often desired to minimize the parasitic resistance associated with contacts otherwise known as external resistance Rext. Decreased Rext enables higher current from an equal transistor design.

BRIEF DESCRIPTION OF THE DRAWINGS

FIG. 1A is a method for forming a transistor structure with low contact resistance in accordance with an embodiment of the present invention.

FIG. 1B is a method for forming a transistor structure with low contact resistance in accordance with another embodiment of the present invention.

Figure 2A:
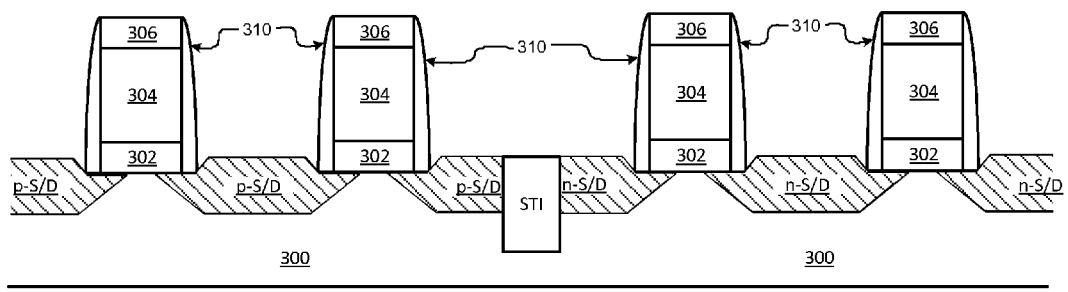
FIGS. 2A to 2I illustrate structures that are formed when carrying out the method of FIG. 1A, in accordance with an embodiment of the present invention.

As will be appreciated, the figures are not necessarily drawn to scale or intended to limit the claimed invention to the specific configurations shown. For instance, while some figures generally indicate straight lines, right angles, and smooth surfaces, an actual implementation of a transistor structure may have less than perfect straight lines, right angles, and some features may have surface topology or otherwise be non-smooth, given real world limitations of the processing equipment and techniques used. In short, the figures are provided merely to show example structures.

DETAILED DESCRIPTION

Techniques are disclosed for forming transistor devices having reduced parasitic contact resistance relative to conventional devices. In some example embodiments, a MOS structure is configured such that the p-MOS source/drain regions are covered with the p-type germanium before or after contact trench formation, and an n-type III-V semiconductor material layer is provided over both the n-MOS regions and the germanium-covered p-MOS regions. As such, the p-MOS source/drain regions covered with p-type germanium are relatively taller than the n-MOS silicon source/drain regions. An etch-back process can then be performed to take advantage of the source/drain height differential between n-type and p-type regions to self-align contact types to expose the III-V material over the n-MOS regions and germanium over p-MOS regions. The techniques may further include a contact resistance reducing metal deposition followed by germanide/III-V-ide formation anneal, and then deposition of metal contact plugs followed by a polish to remove excess metal to isolate each contact trench from the neighboring one.

General Overview

As previously explained, increased drive current in the transistors can be achieved by reducing device resistance. Contact resistance is one component of a device's overall resistance. A typical transistor contact stack includes, for example, a silicon or silicon germanium (SiGe) source/drain layer, a silicide/germanide layer, a titanium nitride adhesion layer, and a tungsten contact/plug. Silicides and germanides of metals such as nickel, platinum, titanium, cobalt, etc can be formed on the source-drain regions prior to tungsten plug deposition. In such configurations, the contact resistance is relatively high and effectively limited by the silicon or SiGe valence band alignment to the pinning level in the contact metal. Typically, using industry standard silicides such as nickel (or other suitable silicides, such as, titanium, cobalt, aluminum, or platinum), this results in a band misalignment of about 0.5 eV or higher for n-type contacts and 0.3 eV or higher for p-type contacts and correspondingly high resistance.

Thus, and in accordance with an example embodiment of the present invention, an intermediate p-type germanium layer is provided between the p-type source/drain and contact metals, and an intermediate n-type III-V material layer is provided between the n-type source/drain and contact metals. Provided the germanium on p-type source/drain is sufficiently thick, a subsequent etch-back process then results in an exposed surface at the bottom of the contact trenches that includes III-V material areas over n-type source/drains and germanium areas over p-type source/drains. A standard contact formation process flow may proceed from there.

The intermediate III-V material and germanium layers between the source/drain regions and contact metal significantly reduce the band misalignment value and contact resistance. In some example cases, a reduction in contact resistance of about 3× or better is provided (relative to a conventional contact stack similarly configured, but without the intermediate layers of III-V material and germanium). A transmission electron microscopy (TEM) cross-section of such a contact trench in STEM bright field mode can be used to show, for example, III-V material generally matching the shape of the trench (e.g., the shape of the trench bottom). III-V materials have contrast relative to silicon or SiGe. Likewise, a TEM cross-section or secondary ion mass spectrometry (SIMS) profile can be used to show the germanium concentration over the p-type regions, as profiles of epitaxial alloys of silicon and SiGe can readily be distinguished from germanium concentration profiles. Composition profiling and mapping can be used to show the identity of the materials used. Thus, upon analysis, a structure configured in accordance with an embodiment of the present invention composition will effectively show an additional layer of n-type III-V semiconductor material comprising combinations of, for instance, aluminum (Al), gallium (Ga), indium (In), phosphorous (P), arsenic (As), and/or antimony (Sb), along with any n-type dopants (e.g., silicon, germanium, tellurium, or other suitable n-type dopants), over n-type source/drain regions, and a p-type germanium layer (boron-doped, or other suitable p-type dopants) over the p-type regions, and will exhibit contact resistance that is lower than the contact resistance of devices made using conventional contact processes. As will be appreciated, any number of semiconductor devices or circuitry having a need for high performance contacts can benefit from the low resistance contact techniques provided herein.

P-type and n-type selectivity during the fabrication process can be achieved in various ways. In one embodiment, for instance, deposition on NMOS source/drain locations can be avoided by having those NMOS regions masked off during PMOS region deposition, and vice-versa with respect to PMOS selectivity. In another embodiment, both NMOS and PMOS regions can be open simultaneously, but deposition only occurs in the respective NMOS and PMOS regions by way of a corresponding trench. As will be further appreciated in light of this disclosure, selectivity may include natural selectivity. For instance, while p-type doped germanium (e.g., doped with boron concentration in excess of 1E20 $cm^{-3}$) grows on p-type SiGe or silicon source/drain regions, it does not grow on insulator surfaces such as silicon dioxide ($SiO_2$) or silicon nitride (SiN); nor does it grow on, for instance, exposed heavily phosphorous doped silicon in n-type regions. Similarly, an n-type doped III-V material can be any combination of, for instance, Al, Ga, In, P, As, and/or Sb (e.g., doped with silicon, germanium, sulfur, tellurium, etc at a concentration of >1E17 $cm^{-3}$), which will grow on n-type SiGe or silicon source/drain regions and p-type germanium source/drain regions, but will not grow on insulator surfaces such as $SiO_2$ or SiN. Where selectivity is not possible or otherwise not employed or desired, then excess deposition material can be removed, for instance, using planarization/polishing and/or etching.

Further note that the intermediate p-type germanium and n-type III-V material layers can be employed to improve contact resistance in any number of transistor structures and configurations, including planar, raised source/drain, non-planer (e.g., nanowire transistors and finned transistors such as double-gate and frigate transistor structures), as well as strained and unstrained channel structures. In addition, the transistor structures may include source and drain tip regions that are designed, for instance, to decrease the overall resistance of the transistor while improving short channel effects (SCE), as sometimes done. The source/drain regions themselves may also vary. In some example embodiments, the transistor structure includes dopant-implanted source/drain regions or epitaxial (or polycrystalline) replacement source/drain regions of silicon, SiGe alloys, or nominally pure germanium films (e.g., such as those with less than 10% silicon) in a MOS structure. In any such implementations, a layer or cap of, for example, boron doped germanium (or other suitable p-type germanium) can be formed directly over the p-type source/drain regions, and a layer or cap of, for example, silicon doped III-V material (or other suitable n-type III-V material) can be formed directly over the n-type source/drain regions, in accordance with an embodiment of the present invention. A contact metal (or series of metals) can then be deposited and a subsequent reaction (annealing) can be carried out to form metal germanide/III-V-ide source and drain contacts. Metal plug deposition may follow. As will be appreciated in light of this disclosure, the intermediate p-type germanium and/or n-type III-V layers can be formed directly over other parts of the transistor structure as well, such as the poly gate and/or grounding tap regions, if so desired. Any number of structural features can be used in conjunction with p-type germanium and n-type III-V material layers as described herein.

In some embodiments, note that the III-V semiconductor material can be left undoped, and particularly with respect to III-V materials having bandgaps below about 0.5 eV, since the thermal generation of carriers in such small bandgap materials at room temperature is sufficient to enable high conductivity. In other embodiments where doping is used, such as those using III-V materials having an arbitrary bandgap, the doping can be carried out in a number of ways, including both in-situ and ex-situ doping techniques (e.g., similar to doping techniques for the germanium layer over the p-type regions). Some such embodiments employ the use III-V materials having sufficiently high doping levels with a column IV dopant, such as carbon, silicon, germanium, or tin. At very high doping levels (e.g., greater than 1E17 atoms/$cm^3$ substitutional concentration), these amphoteric dopants contribute carriers in both valence and conduction bands, thereby increasing carrier concentration for both carrier types. In some such case, the doping is carried out in-situ. In other embodiments, an intrinsic III-V material layer is deposited, followed by an ex-situ doping process, such as ion implantation or diffusion doping, so as to provide the desired conductivity (e.g., conductivity with values of for example 100 to 500 S/cm).

Methodology and Architecture

FIG. 1A is a method for forming a transistor structure with low contact resistance in accordance with an embodiment of the present invention. FIGS. 2A through 2I illustrate example structures that are formed as the method is carried out, and in accordance with some embodiments.

The example method includes forming 102 one or more gate stacks on a semiconductor substrate upon which a MOS device may be formed. The MOS device may comprise NMOS or PMOS transistors, or both NMOS and PMOS transistors (e.g., for CMOS devices). FIG. 2A shows an example resulting structure, which in this case includes both NMOS and PMOS transistors formed on the same substrate 300 and separated by a shallow trench isolation (STI). Other suitable forms of isolation between p-type and n-type regions can be used as well. As can be seen, each gate stack is formed over a channel region of a transistor, and includes a gate dielectric layer 302, a gate electrode 304, an optional hardmask 306, and spacers 310 are formed adjacent to the gate stack.

The gate dielectric 302 can be, for example, any suitable oxide such as silicon dioxide ($SiO_2$) or high-k gate dielectric materials. Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer 302 to improve its quality when a high-k material is used. In some specific example embodiments, the high-k gate dielectric layer 302 may have a thickness in the range of 5 Å to around 100 Å thick (e.g., 10 Å). In other embodiments, the gate dielectric layer 302 may have a thickness of one monolayer of oxide material. In general, the thickness of the gate dielectric 302 should be sufficient to electrically isolate the gate electrode 304 from the source and drain contacts. In some embodiments, additional processing may be performed on the high-k gate dielectric layer 302, such as an annealing process to improve the quality of the high-k material.

The gate electrode 304 material can be, for example, polysilicon, silicon nitride, silicon carbide, or a metal layer (e.g., tungsten, titanium nitride, tantalum, tantalum nitride) although other suitable gate electrode materials can be used as well. The gate electrode 304 material, which may be a sacrificial material that is later removed for a replacement metal gate (RMG) process, has a thickness in the range of 10 Å to 500 Å (e.g., 100 Å), in some example embodiments.

The optional gate hard mask layer 306 can be used to provide certain benefits or uses during processing, such as protecting the gate electrode 304 from subsequent etch and/or ion implantation processes. The hard mask layer 306 may be formed using typical hard mask materials, such as such as silicon dioxide, silicon nitride, and/or other conventional insulator materials.

The gate stack can be formed as conventionally done or using any suitable custom techniques (e.g., conventional patterning process to etch away portions of the gate electrode and the gate dielectric layers to form the gate stack, as shown in FIG. 2A). Each of the gate dielectric 302 and gate electrode 304 materials may be formed, for example, using conventional deposition processes such as chemical vapor deposition (CVD), atomic layer deposition (ALD), spin-on deposition (SOD), or physical vapor deposition (PVD). Alternate deposition techniques may be used as well, for instance, the gate dielectric 302 and gate electrode 304 materials may be thermally grown. As will be appreciated in light of this disclosure, any number of other suitable materials, geometries, and formation processes can be used to implement an embodiment of the present invention, so as to provide a low contact resistance transistor device or structure as described herein.

The spacers 310 may be formed, for example, using conventional materials such as silicon oxide, silicon nitride, or other suitable spacer materials. The width of the spacers 310 may generally be chosen based on design requirements for the transistor being formed. In accordance with some embodiments, however, the width of the spacers 310 is not subject to design constraints imposed by the formation of the source and drain epi-tips, given sufficiently high boron doped germanium content in the source/drain tip regions.

Any number of suitable substrates can be used to implement substrate 300, including bulk substrates, semiconductors-on-insulator substrates (XOI, where X is a semiconductor material such as silicon, germanium, or germanium-enriched silicon), and multi-layered structures, including those substrates upon which fins or nanowires can be formed prior to a subsequent gate patterning process. In some specific example cases, the substrate 300 is a germanium or silicon or SiGe bulk substrate, or a germanium or silicon or SiGe on oxide substrate. Although a few examples of materials from which the substrate 300 may be formed are described here, other suitable materials that may serve as a foundation upon which a low resistance transistor device may be built falls within the spirit and scope of the claimed invention.

With further reference to FIG. 1A, after the one or more gate stacks are formed, the method continues with defining 104 the p-type and n-type source/drain regions of the transistor structure. The source/drain regions can be implemented with any number of suitable processes and configurations. For example, the source/drain regions may be implanted, etched and epi filled, raised, silicon or germanium or SiGe alloy, p-type and/or n-type, and have a planar or fin or wire shaped diffusion region. For instance, in some such example cases, the source and drain regions can be formed using either an implantation/diffusion process or an etching/deposition process. In the former process, dopants such as boron, aluminum, antimony, phosphorous, or arsenic may be ion-implanted into the substrate 300 to form the source and drain regions. The ion implantation process is typically followed by an annealing process that activates the dopants and may also cause them to diffuse further into the substrate 300. In the latter process, the substrate 300 may first be etched to form recesses at the locations of the source and drain regions. An epitaxial deposition process may then be carried out to fill the recesses with a silicon alloy such as silicon germanium or silicon carbide, thereby forming the source and drain regions. In some implementations the epitaxially deposited silicon alloy may be doped in-situ or ex-situ with dopants such as boron, arsenic, or phosphorous, depending on whether the region is intended for p-type or n-type function.

In the example embodiment shown in FIGS. 2A-2I, substrate 300 has been etched to provide cavities as well as respective tip areas which undercut the gate dielectric 302. The cavities and tip areas have been filled to provide the source/drain regions and the optional tip regions, also referred to as source-drain extensions. In accordance with some specific example embodiments where the substrate 300 is a silicon bulk or silicon-on-insulator (SOI) substrate, the source and drain cavities along with their respective tip areas are filled with in-situ doped silicon or SiGe or germanium thereby forming the source and drain regions (along with their respective epi-tip). Any number of source/drain layer configurations can be used here, with respect to materials (e.g., doped or undoped Si, Ge, SiGe), dopant (e.g., boron, arsenic, or phosphorous), and geometries (e.g., thickness of source/drain layer may range, for instance, from 50 to 500 nm so as to provide a flush or raised source/drain regions).

As will be appreciated in light of this disclosure, any number of other transistor features may be implemented with an embodiment of the present invention. For instance, the channel may be strained or unstrained, and the source/drain regions may or may not include tip regions formed in the area between the corresponding source/drain region and the channel region. In this sense, whether a transistor structure has strained or unstrained channels, or source-drain tip regions or no source-drain tip regions, is not particularly relevant to various embodiments of the present invention, and such embodiments are not intended to be limited to any particular such structural features. Rather, any number of transistor structures and types, and particularly those structures have both n-type and p-type source/drain transistor regions, can benefit from employing a small bandgap and/or otherwise sufficiently doped III-V material layer over the n-type source/drain regions and sufficiently doped germanium over the p-type source/drain regions, as described herein. In general, if the III-V material bandgap is small enough, then no dopant is needed at room temperature (although dopant can be used, if so desired). In one specific example case, undopd indium antimonide serves the n-type source/drain regions and boron-doped germanium serves the p-type source/drain regions. For larger bandgap III-V materials (>0.5 eV), however, doping can be used to provide the desired conductivity in the n-type III-V material.

Figure 2B:
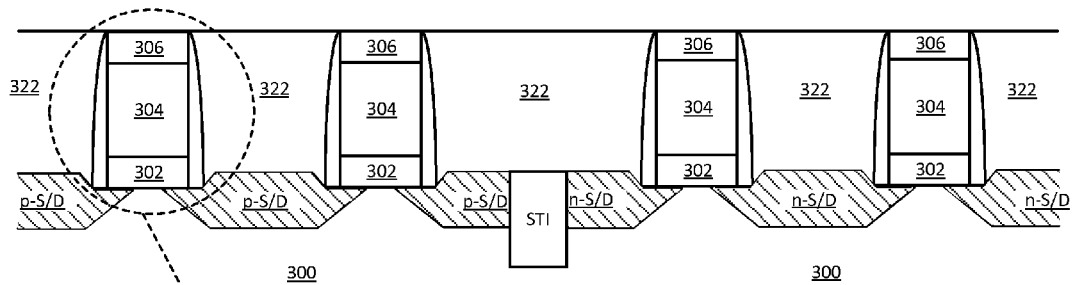
Figure 2B:
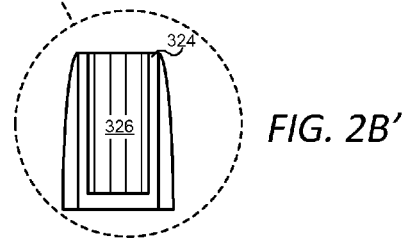

With further reference to FIG. 1A, after the source/drain regions are defined, the method of this example embodiment continues with depositing 106 an insulator layer 322. FIG. 2B shows insulator layer 322 as being flush with the hard mask 306 of the gate stack, but it need not be. The insulator can be configured in a number of ways. In some embodiments, insulator layer 322 is implemented with $SiO_2$ or other low-k dielectric (insulator) materials. In a more general sense, the dielectric constant of the layer 322 materials can be selected as desired. In some embodiments, insulator layer 322 may include a liner (e.g., silicon nitride) followed by one or more layers of $SiO_2$, or any combination of nitride, oxide, oxynitride, carbide, oxycarbide, or other suitable insulator materials. The insulator layer 322, which may be referred to as an interlayer dielectric (ILD), may be planarized as commonly done (e.g., by way of a post-deposition planarization process, such as chemical mechanical planarization, or CMP). Other example insulator materials that can be used to form layer 322 include, for instance, carbon doped oxide (CDO), organic polymers such as perfluorocyclobutane or polytetrafluoroethylene, fluorosilicate glass (FSG), and organosilicates such as silsesquioxane, siloxane, or organosilicate glass. In some example configurations, the insulator layer 322 may include pores or other voids to further reduce its dielectric constant.

As will be appreciated in light of this disclosure, and in accordance with some embodiments of the present invention where a replacement metal gate (RMG) process is used, the method may further include removing the gate stack (including the high-k gate dielectric layer 302, the sacrificial gate electrode 304, and the hard mask layer 306) using an etching process as conventionally done. In some such cases, only the sacrificial gate 304 and hard mask layer 306 are removed. If the gate dielectric layer 302 is removed, the method may continue with depositing a new gate dielectric layer into the trench opening. Any suitable gate dielectric materials such as those previously described may be used here, such as hafnium oxide. The same deposition processes may also be used. Replacement of the gate dielectric layer may be used, for example, to address any damage that may have occurred to the original gate dielectric layer during application of the dry and wet etch processes, and/or to replace a low-k or sacrificial dielectric material with a high-k or otherwise desired gate dielectric material. In such RMG processes, the method may further include depositing the gate electrode layer into the trench and over the gate dielectric layer. Conventional deposition processes may be used to form the replacement gate electrode, such as CVD, ALD, and PVD. The gate electrode layer may include, for example, a p-type workfunction metal, such as ruthenium, palladium, platinum, cobalt, nickel, and conductive metal oxides, e.g., ruthenium oxide. In some example configurations, two or more metal gate electrode layers may be deposited. For instance, a workfunction metal may be deposited in the gate trench followed by a suitable metal gate electrode fill metal such as aluminum or silver. FIG. 2B' shows an example gate structure resulting from such an optional RMG process, which includes a replacement gate electrode layer 326 over a replacement gate dielectric layer 324. Still in other embodiments, such RMG processing can take place later in the method (e.g., after step 118), so that the replacement gate materials will not be subjected to the processing associated with steps 118 and earlier.

Figure 2C:
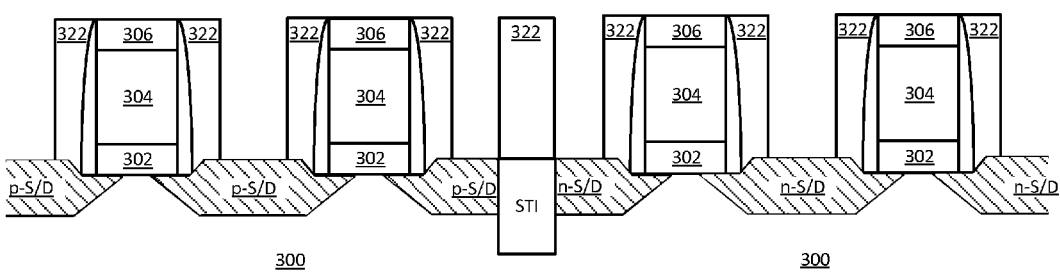

With further reference to FIG. 1A, after insulator layer 322 is provided (and any desired pre-contact formation RMG process), the method continues with etching 108 to form the source/drain contact trenches. Standard lithography followed by any suitable dry and/or wet etch processes can be used. FIG. 2C shows the source/drain contact trenches after etching is complete, in accordance with one example embodiment.

Figure 2D:
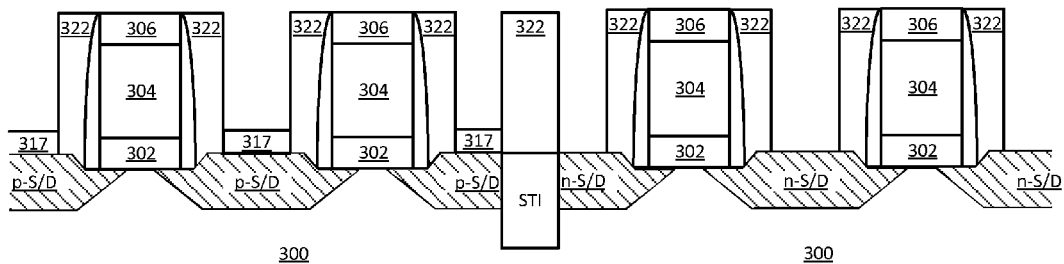

The method continues with selectively depositing 110 a p-type germanium layer 317 into the trench and over the p-type source/drain regions of the transistor structure, as best shown in FIG. 2D. Note that, as a result of this selective germanium deposition, the p-type source/drain regions are now effectively relatively taller than the shorter n-type source/drain regions. In some embodiments, the p-type germanium layer 317 comprises boron doped germanium, although other suitable p-type germanium can also be used. A benefit of the boron doped germanium process is that it is selective to both insulator 322 and n-type silicon of SiGe source/drain regions. In some such example embodiments, the boron doped germanium layer 317, which may be epitaxially deposited in one or more layers, has a germanium concentration in excess of 90 atomic %, although other suitable concentration levels can be used as will be appreciated in light of this disclosure (e.g., in excess of 91 atomic %, or 92 atomic %, . . . , or 98 atomic %, or 99 atomic %, or truly pure germanium). Note that this germanium concentration may be fixed or graded so as to increase from a base level (near substrate 300) to a high level (e.g., in excess of 90 atomic %). The boron concentration in some such embodiments can be in excess of 1E20 cm-3, such as higher than 2E20 cm-3 or 2E21 cm-3, and may also be graded so as to increase from a base level near substrate 300 to a high level (e.g., in excess of 1E20 cm-3 or 2E20 cm-3 or 3E20 cm-3, . . . , 2E21 cm-3). In embodiments where the germanium concentration of the underlying p-type source/drain regions is fixed or otherwise relatively low, a graded buffer may be used to better interface source/drain regions with the boron doped germanium layer 317. The thickness of the boron doped germanium layer 317 may have a thickness in the range, for example, of 50 to 250 Å, in accordance with some specific example embodiments, although alternative embodiments may have other layer thicknesses, as will be apparent in light of this disclosure.

In some embodiments, a CVD process or other suitable deposition technique may be used for the depositing 110 or otherwise forming the boron doped germanium layer 317. For example, the depositing 110 may be carried out in a CVD, or rapid thermal CVD (RT-CVD), or low pressure CVD (LP-CVD), or ultra-high vacuum CVD (UHV-CVD), or gas source molecular beam epitaxy (GS-MBE) tool using germanium and boron containing precursors such as germane (GeH4) or digermane (Ge2H6) and diborane (B2H6) or boron difluoride (BF2). In some such embodiments, there may be a carrier gas such as, for instance, hydrogen, nitrogen, or a noble gas (e.g., precursor is diluted at 1-20% concentration with the balance being carrier gas). There may also be an etchant gas such as, for example, halogen-based gas such as hydrogen chloride (HCl), chlorine (Cl), or, hydrogen bromide (HBr). The basic deposition of germanium and also boron doped germanium is possible over a wide range of conditions using deposition temperature in the range, for example, of 300° C. to 800° C. (e.g., 400-500° C.) and reactor pressure, for instance, in the range 1 Torr to 760 Torr. Germanium is naturally selective in that it deposits on silicon or silicongermanium alloy, and does not deposit on other materials such as silicon dioxide and silicon nitride. Since this natural selectivity is not entirely perfect, a small flow of etchant can be used to increase the selectivity of the deposition, as previously noted. Each of the carrier and etchants can have a flow in the range of 10 and 300 SCCM (typically, no more than 100 SCCM of flow is required, but some embodiments may require higher flow rates). In one specific example embodiment, the deposition 206 is carried out using GeH4 that is diluted in hydrogen at a 1% concentration and at a flow rate that ranges between 100 and 1000 SCCM. For an in situ doping of boron, diluted B2H6 may be used (e.g., the B2H6 may be diluted in H2 at 3% concentration and at a flow rate that ranges between 10 and 300 SCCM). In some such specific example cases, an etching agent of HCl or Cl2 is added at a flow rate that ranges, for example, between 10 and 100 SCCM, to increase the selectivity of the deposition.

As will be further appreciated in light of this disclosure, the selectivity at which the p-type germanium layer 317 is deposited can vary as desired. In some cases, for instance, the p-type germanium layer 317 is deposited only on the p-type source/drain regions or a portion of those regions (rather than across the entire structure). Any number of masking/patterning and/or natural selectivity techniques can be used or otherwise exploited to selectively deposit layer 317. Moreover, other embodiments may benefit from layer 317 covering, for example, exposed poly gate regions or exposed grounding tap regions. As will further be appreciated in light of this disclosure, the combination of high germanium concentration (e.g., in excess of 90 atomic % and up to pure germanium) and high dopant concentration (e.g., boron in excess of 2E20 cm-3) can be used to realize significantly lower contact resistance in the p-type source and drain regions (and other areas where low contact resistance is desirable, such as ground tap regions), in accordance with some example embodiments. Further, and as previously explained, since boron diffusion is sufficiently suppressed by pure germanium, no adverse SCE degradation is realized with subsequent thermal anneals despite any high boron concentration proximate the channel (if applicable). Barrier height lowering is also enabled from the higher concentration of germanium at the contact surface. In some example embodiments, a germanium concentration in excess of 95 atomic % and up to pure germanium (100 atomic %) can be used for layer 317 to achieve such benefits.

Figure 2E:
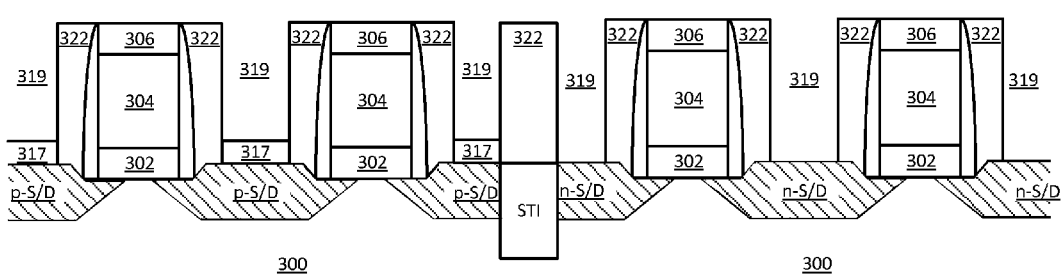
Figure 2F:
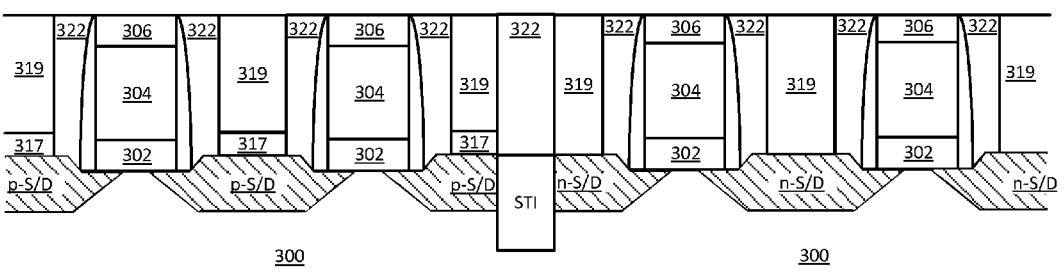

Once the germanium layer 317 is provided, the method continues with depositing 112 a III-V semiconductor material layer on the n-type source/drain regions of the transistor structure, as well as over the germanium covered p-type source drain regions of the transistor structure. FIG. 2E shows the III-V material layer 319 over both n-type and germanium covered p-type source/drain regions, in accordance with one example embodiment. As will be appreciated, this deposition 112 can be carried out non-selectively, where any excess III-V deposition is subsequently removed from the top of insulator 322 (and gate stacks, if necessary), as best shown in FIG. 2F. In other embodiments, the deposition 112 can be carried out selectively, where the III-V material deposition is only on the n-type source/drain regions and the germanium covered p-type source/drain regions. For instance, deposition 112 may comprise a highly n-type (e.g., Si, Ge, S, Te etc) doped (>1E17 cm-3) III-V layer having any combination of Al, Ga, In and P, As, Sb that is naturally selective to the insulator 322 layer (e.g., $SiO_2$ or SiN). In such selective cases, layer 319 will grow on n-type SiGe or silicon source/drain regions and p-type germanium covered source/drain regions, but will not grow on insulator surfaces such as $SiO_2$ or SiN.

In some embodiments, the deposition 112 can be made with a single composition of doped III-V material on all source/drain regions (including germanium covered p-type regions). Alternatively, the deposition 112 can be made with a single composition of undoped III-V material on all source/drain regions (including germanium covered p-type regions), where the undoped III-V material has a bandgap of less than 0.5 eV (e.g., bandgap of $In_xGa_{1-x}As$=0.427 eV, where x=0.9). In some such small bandgap cases, the bandgap is less than 0.4 eV (e.g., bandgap of InAs=0.36 eV). In still other such cases, the bandgap is less than 0.3 eV. In still other such cases, the bandgap is less than 0.2 eV (e.g., bandgap of InSb=0.17 eV). In still other such cases, the bandgap is within a range, such as between 0.1 eV and 0.4 eV, or 0.1 eV and 0.25 eV, or 0.25 eV and 0.5 eV or 0.15 eV and 0.35 eV. Note, however, that the III-V materials need not be limited to having a bandgap of less than 0.5 eV. This is because the III-V material can be deposited, for instance, with in-situ doping, diffusion doping, or implant doping such that it is tailored to the doping type of the underlying source/drain material.

In some example embodiments, the III-V material layer 319 is epitaxially deposited. The thickness of the III-V material layer 319 may be in the range, for example, of 50 to 250 Å, in accordance with some specific example embodiments, although other embodiments may have other layer thicknesses, as will be apparent in light of this disclosure. Similar deposition techniques used to form the p-type germanium layer 317 can be used to form the n-type III-V material layer 319 (e.g., CVD, RT-CVD, LP-CVD, UHV-CVD, PVD, ALD, MBE or GS-MBE) using III-V material compounds, such as combinations of Al, Ga, In, P, As, Sb, and/or precursors thereof. In one specific such example embodiment, the III-V material layer 319 is implemented with undoped indium antimonide (InSb). In another embodiment, the III-V material layer 319 is implemented with GaAs doped with Ge to provide substitutional Ge concentrations of 1E19 atom/$cm^3$ or higher, which results in resistivity of about 5E-3 Ohm-cm (or a corresponding conductivity of about 200 Mho/cm). In any such embodiments, there may be a carrier gas such as, for instance, hydrogen, nitrogen, or a noble gas (e.g., precursor is diluted at 1-20% concentration with the balance being carrier gas). In some example cases, there may be an arsenic precursor such as arsine or TBA, a gallium precursor such as TMG, and/or an indium precursor such as TMI. There may also be an etchant gas such as, for example, halogen-based gas such as hydrogen chloride (HCl), chlorine (Cl), or, hydrogen bromide (HBr). The basic deposition of the III-V semiconductor material layer 319 is possible over a wide range of conditions using deposition temperature in the range, for example, of 300° C. to 700° C. (e.g., 300-500° C.) and reactor pressure, for instance, in the range 1 Torr to 760 Torr. Each of the carrier and etchants can have a flow in the range of 10 and 300 SCCM (typically, no more than 100 SCCM of flow is required, but some embodiments may benefit from higher flow rates). In one specific example embodiment, the deposition 112 is carried out at a flow rate that ranges between 100 and 1000 SCCM. For an in-situ doping of germanium, for instance, diluted germane or digermane may be used (e.g., the germane may be diluted in H2 at 10% concentration and at a flow rate that ranges between 10 and 100 sccm).

Any number of masking/patterning techniques can be used further define the regions to selectively deposit layer 319. Moreover, other embodiments may benefit from layer 319 covering, for example, poly gate regions or grounding tap regions. As will further be appreciated in light of this disclosure, the III-V material layer 319 can be used to realize significantly lower contact resistance in the n-type source and drain regions (and other areas where low contact resistance is desirable, such as ground tap regions), in accordance with some example embodiments.

Figure 2G:
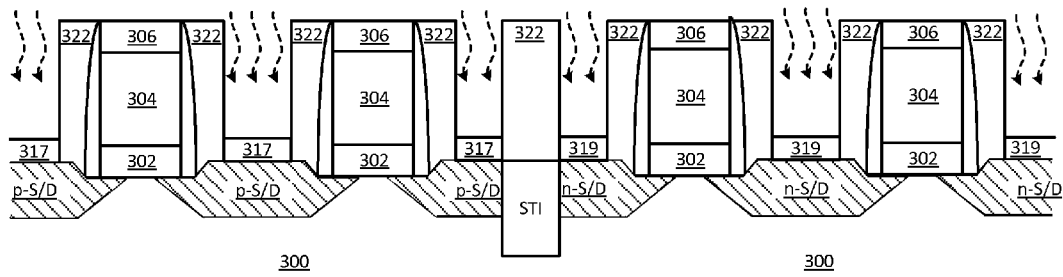

With further reference to FIG. 1A, the method continues with etching back 114 the III-V material deposition layer to expose the underlying germanium layer 317 over the p-type source/drain regions and a smaller thickness of III-V material layer 319 over the n-type source/drain regions. Depending on the selectivity and roughness of the III-V deposition, this etch-back process may include an initial planarization/polish (e.g., CMP) to remove excess III-V material followed by etching (dry and/or wet etching can be used). An example resulting structure of this etch-back process is shown in FIG. 2G (FIG. 2F shows an optional planarization step prior to the etching shown in FIG. 2G). Since the III-V deposition is generally rough, it can be deposited to a relatively large thickness and then etched back using, for example, a dry etch to planarize and at the same time thin the III-V layer 319. Provided the initial germanium layer 317 on p-type source/drain regions is sufficiently thick, the etch-back process results in an exposed surface at the bottom of the contact trenches that includes III-V areas 319 over the n-type source/drain regions and germanium areas 317 over p-type source/drain regions. Thus, the etch-back process 114 effectively takes advantage of the height differential to self-align contact types. A standard or custom contact formation process flow may proceed from here to yield low resistance p and n contacts.

Figure 2H:
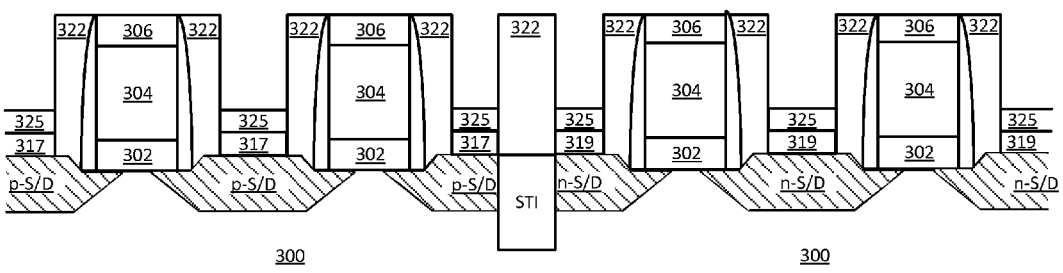
Figure 2I:
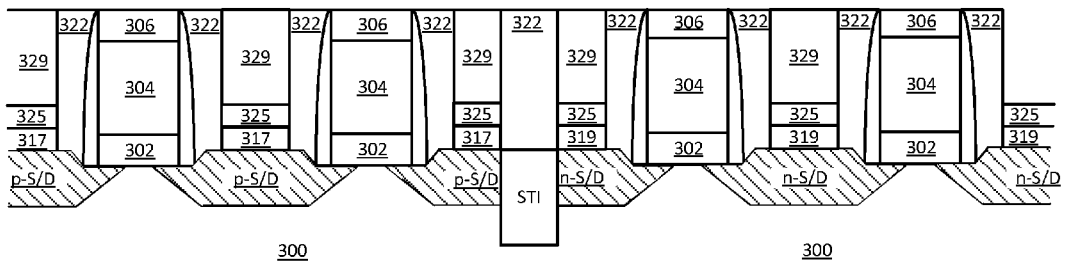

The method then continues with depositing 116 contact resistance reducing metal and annealing over the p-type germanium layers 317 and n-type III-V material layers 319, and then depositing 118 the source/drain contact plugs over each. Note in such embodiments that there is no silicide or germanide over the n-type source/drain regions. Rather, any reaction is between the III-V material 319 and the metallic contact resistance reduction layer 325, which is generally referred to herein as the III-V-ide. FIG. 2H shows the contact resistance reducing metals 325, which in some embodiments include silver, nickel, aluminum, titanium, gold, gold-germanium, nickel-platinum or nickel-aluminum, and/or other such resistance reducing metals or alloys. Other embodiments may further include additional layers, such as adhesion layers between layer 317 and layer 325 and/or between layer 319 and layer 325, if so desired. FIG. 2I shows the contact plug metal 329, which in some embodiments includes aluminum or tungsten, although any suitably conductive contact metal or alloy can be used, such as silver, nickel, platinum, titanium, or alloys thereof, using conventional deposition processes. The process may further include a planarization/polish to remove excess metal and to isolate each contact trench from the neighboring one. In some example case, transistors having a source/drain configured with both germanium layer 317 and III-V material layer 319 at the interface between the corresponding source/drain regions and the contact resistance reducing metal 325, can exhibit resistivity values of less than 100 Ohm-um, and in some cases less than 90 Ohm-um, and in some cases less than 80 Ohm-um, and in some cases less than 75 Ohm-um, or lower.

Figure 3A:
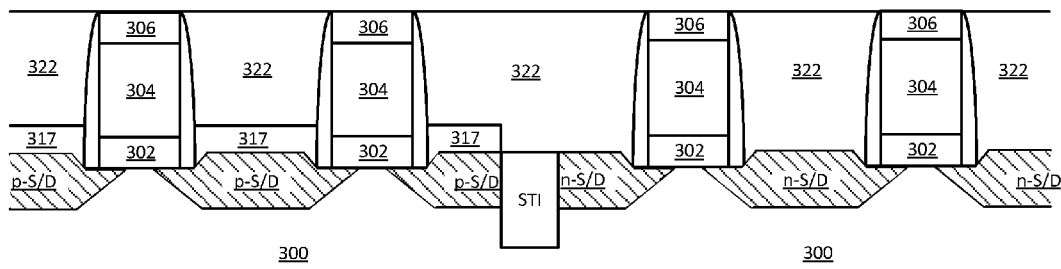
FIGS. 3A to 3C illustrate alternative structures that are formed when carrying out the method of FIG. 1B, in accordance with another embodiment of the present invention.
Figure 3B:
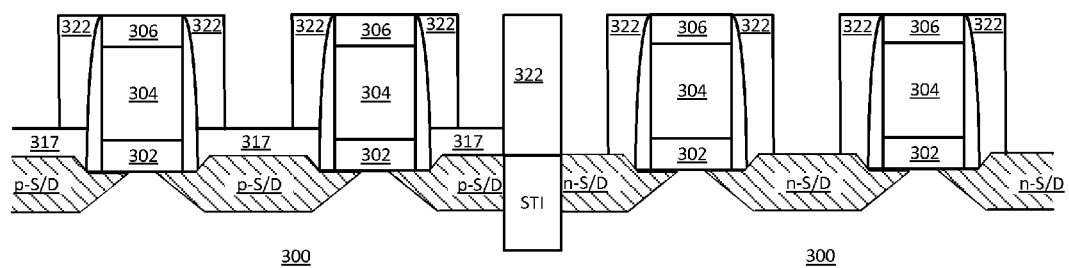
Figure 3C:
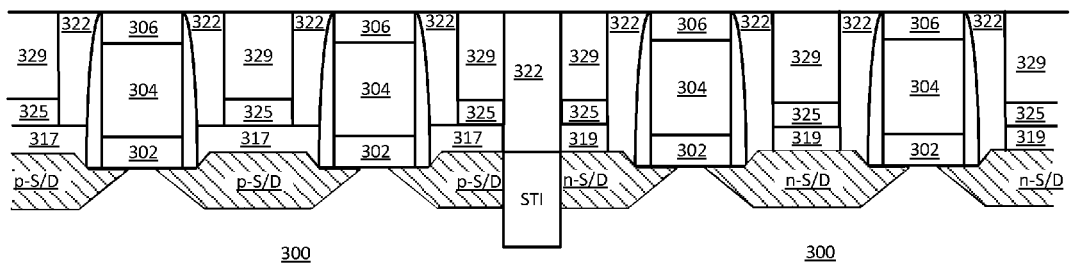

FIG. 1B is a method for forming a transistor structure with low contact resistance in accordance with another embodiment of the present invention. FIGS. 3A through 3C illustrate alternative example structures that are formed. In general, this method is similar to the method described with reference to FIGS. 1A and 2A-I, except that the deposition of the germanium material layer 317 on the p-type source/drain regions is carried out prior to deposition of insulator 322. This is effectively indicated in FIG. 1B by moving the germanium material depositing 110 to be after the source/drain defining 104 and prior to the insulator depositing 106. This resulting structure after insulator deposition 106 is shown in FIG. 3A. Note how in this example embodiment the germanium layer 317 entirely covers each of the shown p-type source/drain regions, rather than just the portion exposed by the contact trench (as best shown in FIG. 2D). FIG. 3B shows the resulting structure after the contact trenches are etched at 108, and FIG. 3C shows the resulting structure after the deposition 112 and etch-back 114 of the n-e III-V material and after deposition of the contact resistance reducing metal 325 and metal contact plugs 329 at 116 and 118, respectively. As will be appreciated, the previous relevant discussion with respect to similar parts of the example method discussed with reference to FIG. 1A is equally applicable here.

Non-Planar Configuration

A non-planar architecture can be implemented, for instance, using FinFETs or nanowire configurations. A FinFET is a transistor built around a thin strip of semiconductor material (generally referred to as the fin). The transistor includes the standard field effect transistor (FET) nodes, including a gate, a gate dielectric, a source region, and a drain region. The conductive channel of the device resides on/within the outer sides of the fin beneath the gate dielectric. Specifically, current runs along both sidewalls of the fin (sides perpendicular to the substrate surface) as well as along the top of the fin (side parallel to the substrate surface). Because the conductive channel of such configurations essentially resides along the three different outer, planar regions of the fin, such a FinFET design is sometimes referred to as a tri-gate FinFET. Other types of FinFET configurations are also available, such as so-called double-gate FinFETs, in which the conductive channel principally resides only along the two sidewalls of the fin (and not along the top of the fin). A nanowire transistor (sometimes referred to as gate-all-around FET) is configured very similarly, but instead of a fin, a nanowire (e.g., silicon or SiGe or Ge nanowire) is used and the gate material generally surrounds the channel region on all sides. Depending on the particular design, nanowire transistors have, for instance, four effective gates.

Figure 4A:
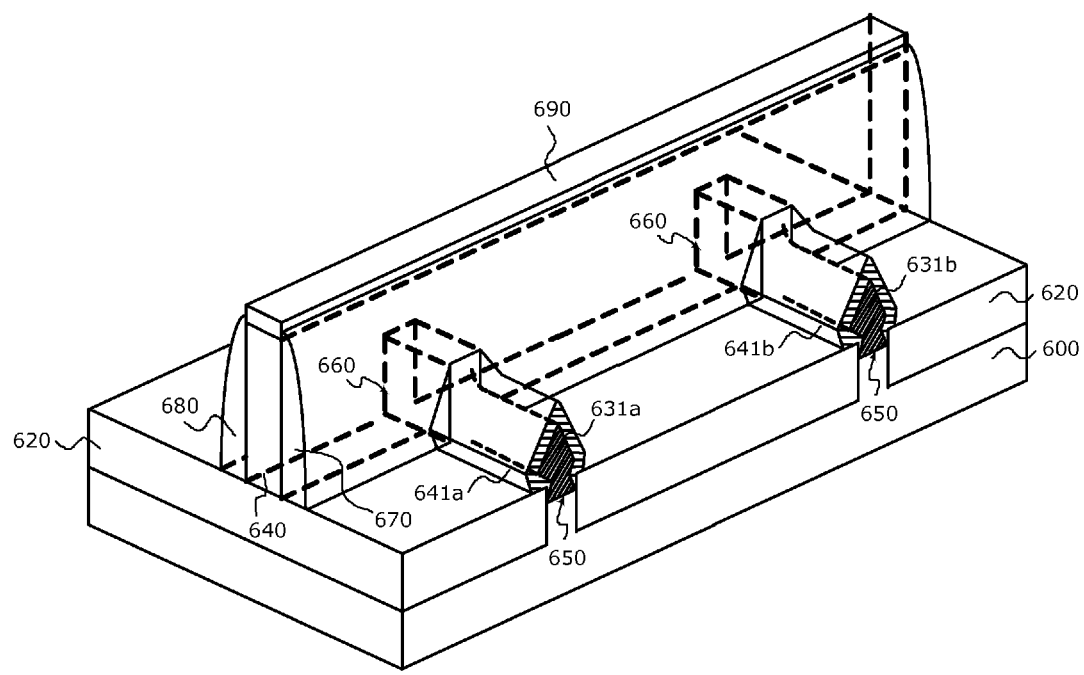
FIG. 4A-E each show a perspective view of a non-planar transistor architecture, configured in accordance with one embodiment of the present invention.
Figure 4B:
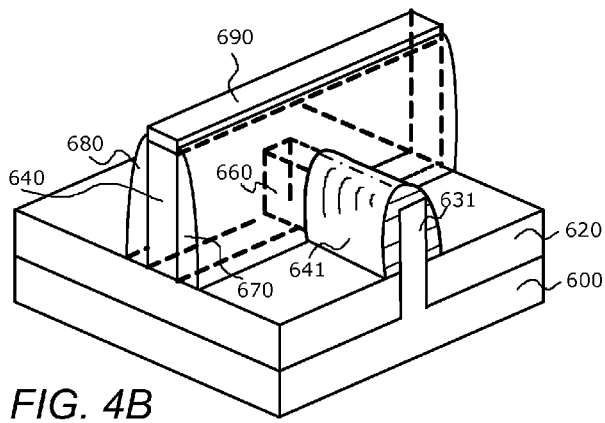
Figure 4C:
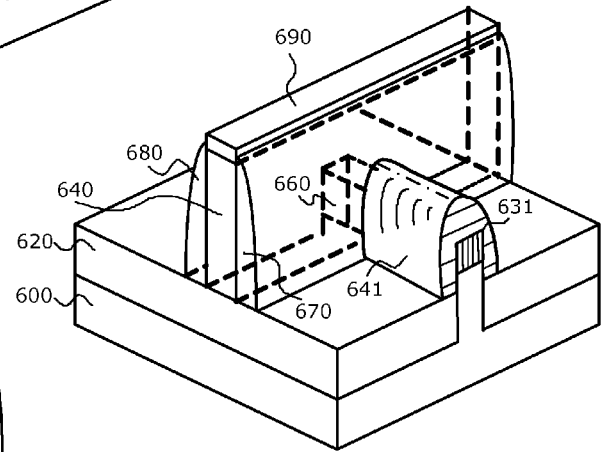
Figure 4D:
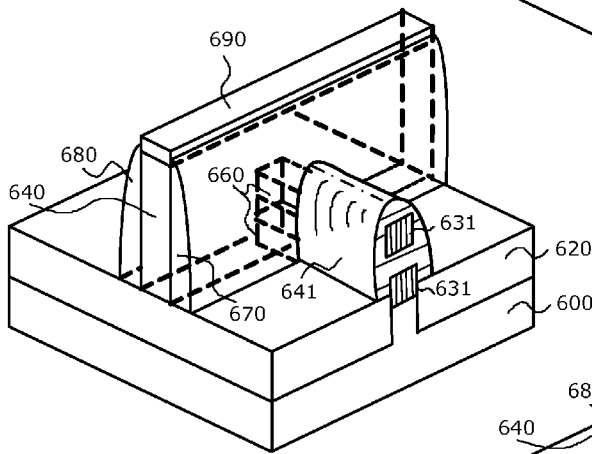
Figure 4E:
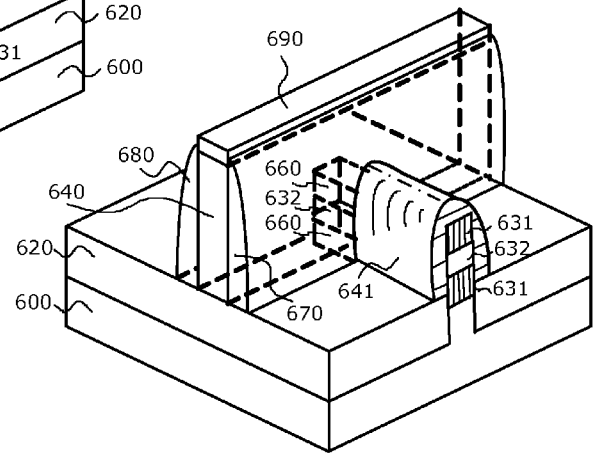

FIGS. 4A-4E each show a perspective view of an example non-planar architecture, configured in accordance with one embodiment of the present invention. Specifically, FIGS. 4A-B each shows a perspective view of a FinFET transistor structure and FIGS. 4C-E show example nanowire channel transistor structures. Each of the figures will now be discussed in turn.

As can be seen, the example non-planar configuration shown in FIG. 4A is implemented with tri-gate devices each of which includes a substrate 600 having a semiconductor body or fin 660 extending from the substrate 600 through isolation regions 620. A gate electrode 640 is formed over three surfaces of the fin 660 to form three gates. A hard mask 690 is formed on top of the gate electrode 640. Gate spacers 670, 680 are formed at opposite sidewalls of the gate electrode 640. A p-type source region comprises the epitaxial region 631a formed on a recessed source interface 650 and on one fin 660 sidewall, and a drain region comprises the epitaxial region 631a formed on a recessed source interface 650 and on the opposing fin 660 sidewall (not shown). In addition, an n-type source region comprises the epitaxial region 631b formed on a recessed source interface 650 and on one fin 660 sidewall, and a drain region comprises the epitaxial region 631b formed on a recessed source interface 650 and on the opposing fin 660 sidewall (not shown). A p-type germanium cap layer 641a is deposited over the source/drain regions 631a, and an n-type III-V cap layer 641b is deposited over the source/drain regions 631b. Note that the germanium and III-V material cap layers 641a and 641b, respectively, may be provided in the corresponding recessed (tip) regions, but in other embodiments are just provided over the source/drain regions (and not in the recessed regions). In one embodiment, the isolation regions 620 are shallow trench isolation (STI) regions formed using conventional techniques, such as etching the substrate 600 to form trenches, and then depositing oxide material onto the trenches to form the STI regions. The isolation regions 620 can be made from any suitable dielectric/insulative material, such as SiO$_2$. The previous discussion with respect to the substrate 300 is equally applicable here (e.g., substrate 600 may be a silicon substrate, or XOI substrate such as a SOI substrate, or a multi-layered substrate). As will be appreciated in light of this disclosure, conventional processes and forming techniques can be used to fabricate the FinFET transistor structure. However, and in accordance with one example embodiment of the present invention, the p-type source/drain regions 631a and corresponding cap layers 641 a can be implemented, for instance, using an in-situ p-type silicon or SiGe (for 631a) capped with a p-type germanium layer (for 641a), and the n-type source/drain regions 631b and corresponding cap layers 641b can be implemented, for instance, using an in-situ n-type silicon or SiGe (for 631b) capped with an n-type III-V material layer (for 641b). As will further be appreciated, note that an alternative to the tri-gate configuration is a double-gate architecture, which includes a dielectric/isolation layer on top of the fin 660. Further note that the example shape of the source/drain regions 631 (a and b) shown in FIG. 4A is not intended to limit the claimed invention to any particular source/drain types or formation processes, and other source/drain shapes (for both n and p) will be apparent in light of this disclosure (e.g., round, square or rectangular p and n type source/drain regions may be implemented).

As will be appreciated, the source/drain regions 631 (a and b) shown in FIG. 4A were formed using a replacement process (e.g., etching, epitaxy deposition, etc). However, in other embodiments source/drain regions 631 can be part of the fin 660 formed from the substrate 600 material itself, as best shown in FIG. 4B. Only one source/drain region 631 is shown, but numerous such regions can be implemented in a similar fashion (including both n-type and p-e S/D regions). A cap layer 641 is deposited over the source/drain regions 631 in a similar fashion as previously discussed with reference to FIG. 4A (including both n-type III-V material over n-type S/D regions and p-type germanium over p-type S/D regions). Other relevant discussion provided with respect to FIG. 4A is also equally applicable here, as will be appreciated.

Another alternative is the nanowire channel architecture which may include, for example, a pedestal of substrate 600 material upon which a nanowire 660 (e.g., silicon or SiGe) is grown or otherwise provided, as best shown in FIG. 4C. Similar to the fin structure shown in FIG. 4B, the nanowire 660 includes source/drain regions 631 (only one shown, but multiple such regions can be implemented, including both p-type and n-type, as previously explained). Just as with a fin structure, the source/drain regions 631 can be formed from substrate 600 material or one or more replacement materials (e.g., silicon or SiGe). The material 641 can be provided, for instance, around all of the source/drain regions 631 of nanowire 660 or just a portion of the nanowire 660 (e.g., all except the portion on the pedestal). As previously explained, the material 641 can be, for instance, n-type III-V material over n-type S/D regions and p-type germanium over p-type S/D regions. FIG. 4D illustrates a nanowire configuration having multiple nanowires 660 (two in this example case). As can be seen, one nanowire 660 is provided in a recess of substrate 600 and the other nanowire 660 effectively floats in the material 641 layer. The corresponding source/drain regions 631 are shown with vertical cross-hatching, and may be p-type and/or n-type source/drain regions. FIG. 4E also illustrates a nanowire configuration having multiple nanowires 660, but in this example case, non-active material 632 is not removed from between the individual nanowires during the nanowire forming process, which can be carried out using various conventional techniques, as will be appreciated in light of this disclosure. Thus, one nanowire 660 is provided in a recess of substrate 600 and the other nanowire 660 effectively sits on top of the material 632. Note the nanowires 660 are active through the channel, but the 632 material is not. The 641 material is provided around all other exposed surfaces of the nanowires 660. As previously explained, the corresponding source/drain regions 631 are shown with vertical cross-hatching, and may be p-type and/or n-type source/drain regions.

Example System

Figure 5:
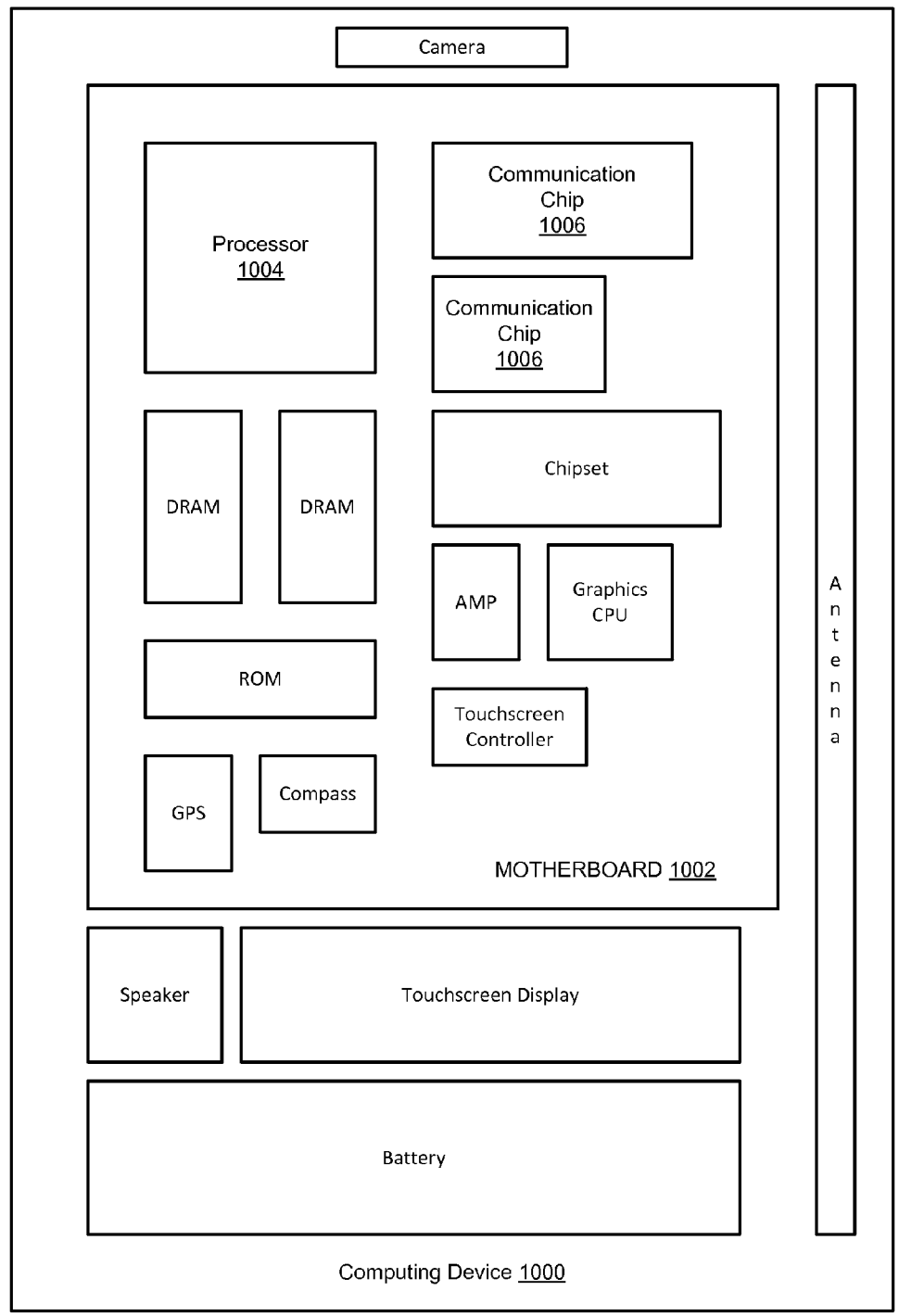
FIG. 5 illustrates a computing system implemented with one or more transistor structures in accordance with an example embodiment of the present invention.

FIG. 5 illustrates a computing system 1000 implemented with one or more transistor structures configured in accordance with an example embodiment of the present invention. As can be seen, the computing system 1000 houses a motherboard 1002. The motherboard 1002 may include a number of components, including but not limited to a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board or a daughterboard mounted on a main board or the only board of system 1000, etc. Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more transistor structures as described herein (e.g., having n-type III-V material layer over n-type source/drain regions and p-type germanium over p-type source/drain regions to provide lower contact resistance/improved conductivity). These transistor structures can be used, for instance, to implement an on-board processor cache or memory array. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments of the present invention, the integrated circuit die of the processor includes onboard memory circuitry that is implemented with one or more CMOS transistor structures having both n-type III-V material layer over n-type source/drain regions and p-type germanium over p-type source/drain regions, as variously described herein. The term "processor" may refer to any device or portion of a device that processes, for instance, electronic data from registers and/or memory to transform that electronic data into other electronic data that may be stored in registers and/or memory.

The communication chip 1006 may also include an integrated circuit die packaged within the communication chip 1006. In accordance with some such example embodiments, the integrated circuit die of the communication chip includes one or more devices implemented with one or more transistor structures as described herein (e.g., on-chip processor or memory). As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the system 1000 may be any other electronic device that processes data or employs low contact resistance transistor devices as described herein (e.g., CMOS devices having both p and n type devices configured with intermediate layers of p-type germanium and n-type III-V material layers, respectively, and as variously described herein).

Numerous embodiments will be apparent, and features described herein can be combined in any number of configurations. One example embodiment of the present invention provides a semiconductor integrated circuit. The integrated circuit includes a substrate having a number of channel regions, and a gate electrode above each channel region, wherein a gate dielectric layer is provided between each gate electrode and a corresponding channel region. The integrated circuit further includes p-type source/drain regions in the substrate and adjacent to a corresponding channel region, and n-type source/drain regions in the substrate and adjacent to a corresponding channel region. The integrated circuit further includes a p-type germanium layer on at least a portion of the p-type source/drain regions, and an n-type III-V semiconductor material layer on at least a portion of the n-type source drain regions. The integrated circuit further includes metal contacts on each of the p-type germanium layer and the n-type III-V semiconductor material layer. In some cases, the n-type III-V semiconductor material layer is undoped. In some cases, the n-type III-V semiconductor material layer has a bandgap of less than 0.5 eV. In some cases, the n-type III-V semiconductor material layer has a bandgap of less than 0.2 eV. In other cases, the n-type III-V semiconductor material layer is doped. In some such cases, the n-type III-V semiconductor material layer is doped with one or more amphoteric dopants. In one such case, the n-type III-V semiconductor material layer is doped with one or more amphoteric dopants to greater than a 1E18 atoms/cm$^3$ substitutional concentration. In some cases, the p-type germanium layer is doped with boron. In one such case, the boron concentration is in excess of 1E20 cm$^{-3}$. In some cases, the device is implemented with a planar transistor architecture. In other cases, the device is implemented with a non-planar transistor architecture. In some such cases, the non-planar transistor architecture comprises at least one of FinFET transistors and/or nanowire transistors. In some cases, the p-type and n-type source/drain regions comprise silicon, germanium, or an alloy thereof. Another embodiment of the present invention includes an electronic device that includes a printed circuit board having one or more integrated circuits as variously defined in this paragraph. In one such case, the one or more integrated circuits comprise at least one of a communication chip and/or a processor. In another such case, the device is a computing device.

Another embodiment of the present invention provides a device, comprising a silicon-containing substrate having a number of channel regions, and a gate electrode above each channel region, wherein a gate dielectric layer is provided between each gate electrode and a corresponding channel region. The device further includes p-type source/drain regions in the substrate and adjacent to a corresponding channel region, and n-type source/drain regions in the substrate and adjacent to a corresponding channel region, the p-type and n-type source/drain regions comprising silicon, germanium, or an alloy thereof. The device further includes a p-type germanium layer on at least a portion of the p-type source/drain regions, and an n-type III-V semiconductor material layer on at least a portion of the n-type source drain regions. The device further includes metal contacts on each of the p-type germanium layer and the n-type III-V semiconductor material layer. In some cases, the n-type III-V semiconductor material layer is undoped. In other cases, the n-type III-V semiconductor material layer is doped. In one such case, the n-type III-V semiconductor material layer is doped with one or more amphoteric dopants. In another such case, the n-type III-V semiconductor material layer is doped with one or more amphoteric dopants to greater than a 1E18 atoms/cm$^3$ substitutional concentration. In some cases, the n-type III-V semiconductor material layer has a bandgap of less than 0.5 eV. In some cases, the p-type germanium layer is doped with boron. In one such case, the boron concentration is in excess of 1E20 cm$^{-3}$.

Another embodiment of the present invention provides a method for forming a semiconductor device. The method includes providing a substrate having a number of channel regions, and providing a gate electrode above each channel region, wherein a gate dielectric layer is provided between each gate electrode and a corresponding channel region. The method further includes providing p-type source/drain regions in the substrate and adjacent to a corresponding channel region, and providing n-type source/drain regions in the substrate and adjacent to a corresponding channel region. The method further includes providing a p-type germanium layer on at least a portion of the p-type source/drain regions, and providing an n-type III-V semiconductor material layer on at least a portion of the n-type source drain regions and over the p-type source drain regions having the p-type germanium layer thereon. The method further includes etching back the n-type III-V semiconductor material layer to expose the underlying p-type germanium over the p-type source drain regions and to thin the n-type III-V semiconductor material layer over the n-type source drain regions. The method further includes providing metal contacts on each of the p-type germanium layer and the n-type III-V semiconductor material layer.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. An integrated circuit, comprising:
   a substrate having a number of channel regions;
   p-type source/drain regions in the substrate and adjacent to a corresponding channel region;

n-type source/drain regions in the substrate and adjacent to a corresponding channel region;
a p-type germanium layer over at least a portion of the p-type source/drain regions; and
an n-type III-V semiconductor material layer over at least a portion of the n-type source drain regions.

2. The integrated circuit of claim 1, further comprising:
contact resistance reducing metal over the p-type germanium layer and the n-type III-V semiconductor material layer; and
source/drain metal contact plugs on the contact resistance reducing metal.

3. The integrated circuit of claim 2, further comprising:
a gate electrode above each channel region, wherein a gate dielectric layer is provided between each gate electrode and a corresponding channel region.

4. The integrated circuit of claim 1, further comprising:
an insulation layer over the substrate, the insulation layer having a contact trench formed over each of the p-type source/drain regions and the n-type source/drain regions, wherein the n-type III-V semiconductor material layer is entirely within the contact trenches formed over the n-type source/drain regions.

5. The integrated circuit of claim 4, wherein the p-type germanium layer is entirely within the contact trenches formed over the p-type source/drain regions.

6. The integrated circuit of claim 4, wherein the n-type III-V semiconductor material layer comprises at least one of aluminum, gallium, indium, phosphorus, arsenide, and antimonide.

7. The integrated circuit of claim 6, wherein the insulation layer comprises at least one of silicon dioxide and silicon nitride.

8. The integrated circuit of claim 7, wherein the substrate is a bulk silicon substrate.

9. The integrated circuit of claim 8, wherein the p-type source/drain regions and n-type source/drain regions are silicon or germanium or a silicon germanium alloy.

10. The integrated circuit of claim 1, wherein the p-type source/drain regions and n-type source/drain regions have a planar diffusion region.

11. The integrated circuit of claim 1, wherein the p-type source/drain regions and n-type source/drain regions have a fin shaped diffusion region.

12. The integrated circuit of claim 1, wherein the p-type source/drain regions and n-type source/drain regions have a wire shaped diffusion region.

13. The integrated circuit of claim 1, wherein the p-type source/drain regions and n-type source/drain regions are raised relative to their corresponding channel region.

14. An integrated circuit, comprising:
a substrate having a number of fins extending therefrom, each fin having a channel region;
p-type source/drain regions in or on the substrate and adjacent to a corresponding channel region;
n-type source/drain regions in or on the substrate and adjacent to a corresponding channel region;
a p-type germanium layer over at least a portion of the p-type source/drain regions; and
an n-type III-V semiconductor material layer over at least a portion of the n-type source drain regions.

15. The integrated circuit of claim 14, further comprising:
an insulation layer over the substrate, the insulation layer having a contact trench formed over each of the p-type source/drain regions and the n-type source/drain regions, wherein the n-type III-V semiconductor material layer is entirely within the contact trenches formed over the n-type source/drain regions;
a gate electrode adjacent each channel region, wherein a gate dielectric layer is provided between each gate electrode and a corresponding channel region;
contact resistance reducing metal over the p-type germanium layer and the n-type III-V semiconductor material layer; and
source/drain metal contact plugs on the contact resistance reducing metal.

16. The integrated circuit of claim 14, wherein each of the p-type source/drain regions and n-type source/drain regions have one of a wire shaped or a fin shaped diffusion area.

17. An integrated circuit, comprising:
a substrate having a number of fins extending therefrom, each fin associated with a nanowire channel region;
p-type source/drain regions in or on the substrate and adjacent to a corresponding channel region;
n-type source/drain regions in or on the substrate and adjacent to a corresponding channel region;
a p-type germanium layer over at least a portion of the p-type source/drain regions; and
an n-type III-V semiconductor material layer over at least a portion of the n-type source drain regions.

18. The integrated circuit of claim 17, further comprising:
an insulation layer over the substrate, the insulation layer having a contact trench formed over each of the p-type source/drain regions and the n-type source/drain regions, wherein the n-type III-V semiconductor material layer is entirely within the contact trenches formed over the n-type source/drain regions;
a gate electrode adjacent each channel region, wherein a gate dielectric layer is provided between each gate electrode and a corresponding channel region;
contact resistance reducing metal over the p-type germanium layer and the n-type III-V semiconductor material layer; and
source/drain metal contact plugs on the contact resistance reducing metal.

19. The integrated circuit of claim 17, wherein each of the p-type source/drain regions and n-type source/drain regions have one of a wire shaped or a fin shaped diffusion area.

20. The integrated circuit of claim 19, wherein at least one of the p-type source/drain regions and/or n-type source/drain regions has a wire shaped diffusion area including multiple wires.

* * * * *